US011114381B2

(12) United States Patent
Liebmann et al.

(10) Patent No.: US 11,114,381 B2
(45) Date of Patent: Sep. 7, 2021

(54) POWER DISTRIBUTION NETWORK FOR 3D LOGIC AND MEMORY

(71) Applicant: Tokyo Electron Limited, Tokyo (JP)

(72) Inventors: Lars Liebmann, Mechanicville, NY (US); Jeffrey Smith, Clifton Park, NY (US); Anton J. deVilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 126 days.

(21) Appl. No.: 16/560,544

(22) Filed: Sep. 4, 2019

(65) Prior Publication Data

US 2020/0075489 A1 Mar. 5, 2020

Related U.S. Application Data

(60) Provisional application No. 62/727,098, filed on Sep. 5, 2018.

(51) Int. Cl.
| | |
|---|---|
| *H01L 23/528* | (2006.01) |
| *H01L 29/08* | (2006.01) |
| *H01L 25/065* | (2006.01) |
| *H01L 27/11* | (2006.01) |

(52) U.S. Cl.
CPC ...... *H01L 23/5286* (2013.01); *H01L 25/0657* (2013.01); *H01L 27/1104* (2013.01); *H01L 29/0847* (2013.01)

(58) Field of Classification Search
CPC combination set(s) only.
See application file for complete search history.

(56) References Cited

U.S. PATENT DOCUMENTS

| | | | |
|---|---|---|---|
| 9,378,320 B2 | 6/2016 | Kawa et al. | |
| 9,400,862 B2 | 7/2016 | Kawa et al. | |
| 9,419,003 B1 | 8/2016 | Colinge et al. | |
| 9,721,951 B2 | 8/2017 | Ikeda et al. | |
| 9,786,663 B2 | 10/2017 | Rasouli et al. | |
| 9,825,043 B2 | 11/2017 | Colinge et al. | |

(Continued)

OTHER PUBLICATIONS

International Search Report and Written Opinion dated May 20, 2020 in PCT/US2019/049506, 9 pages.

*Primary Examiner* — Ratisha Mehta
(74) *Attorney, Agent, or Firm* — Oblon, McClelland, Maier & Neustadt, L.L.P.

(57) ABSTRACT

A semiconductor device is provided. The semiconductor device includes a transistor stack having a plurality of transistor pairs that are stacked over a substrate. Each transistor pair of the plurality of transistor pairs includes a n-type transistor and a p-type transistor that are stacked over one another. The plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs. The semiconductor device further includes one or more conductive planes formed over the substrate. The one or more conductive planes are positioned adjacent to the transistor stack, span a height of the transistor stack and are electrically coupled to the transistor stack.

20 Claims, 11 Drawing Sheets

(56) References Cited

U.S. PATENT DOCUMENTS

| | | | |
|---|---|---|---|
| 9,947,664 B1* | 4/2018 | Anderson | ........... H01L 29/7827 |
| 10,074,609 B2 | 9/2018 | Rasouli et al. | |
| 10,157,928 B2 | 12/2018 | Colinge et al. | |
| 10,256,223 B2 | 4/2019 | Kawa et al. | |
| 10,580,774 B2 | 3/2020 | Rasouli et al. | |
| 2015/0054567 A1 | 2/2015 | Rasouli et al. | |
| 2015/0102419 A1 | 4/2015 | Ikeda et al. | |
| 2015/0370948 A1 | 12/2015 | Kawa et al. | |
| 2015/0370950 A1 | 12/2015 | Kawa et al. | |
| 2015/0370951 A1 | 12/2015 | Kawa et al. | |
| 2016/0329313 A1 | 11/2016 | Kawa et al. | |
| 2016/0336329 A1 | 11/2016 | Colinge et al. | |
| 2017/0221826 A1 | 8/2017 | Rasouli et al. | |
| 2018/0069011 A1 | 3/2018 | Colinge et al. | |
| 2018/0108577 A1* | 4/2018 | Zhu | ................. H01L 21/823885 |
| 2018/0108659 A1 | 4/2018 | Anderson et al. | |
| 2018/0122807 A1 | 5/2018 | Anderson et al. | |
| 2018/0342515 A1 | 11/2018 | Rasouli et al. | |

* cited by examiner

POWER DISTRIBUTION NETWORK FOR 3D LOGIC AND MEMORY

CROSS REFERENCE TO RELATED APPLICATIONS

This application claims the benefit of U.S. Provisional Application No. 62/727,098 filed on Sep. 5, 2018, the entire contents of which is incorporated herein by reference.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Techniques herein provide device architectures and process methods that help enable 3D scaling of transistors. Such techniques provide a power-wall structure to support monolithically integrated 3D logic or memory devices. Such design enables power to be drawn at all levels throughout a device stack. Power can be fed into vertical power-walls from either above (as in conventional power delivery networks), or from below through buried power-rails. Such buried power-rails (or conventional top down power distribution network (PDN)) can be configured to run either parallel to the vertical power-walls or perpendicular to the vertical power-walls. Such structures can be used for logic or memory devices.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device includes a transistor stack having a plurality of transistor pairs that are stacked over a substrate. Each transistor pair of the plurality of transistor pairs includes a n-type transistor and a p-type transistor that are stacked over one another. The plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs. The semiconductor device further includes one or more conductive planes formed over the substrate. The one or more conductive planes are positioned adjacent to the transistor stack, span a height of the transistor stack and are electrically coupled to the transistor stack.

The semiconductor device can include a plurality of power rails that are positioned below the transistor stack. In some embodiments, each of the one or more conductive planes is positioned over and extends along a respective power rail so as to form a continuous connection. In some embodiments, each of the one or more conductive planes is positioned over and across two or more power rails of the plurality of power rails so as to form two or more connection points.

In some embodiments, the one or more conductive planes include a continuous lateral structure to draw power from the one or more power-rails into the transistor stack. In some embodiments, the one or more conductive planes include a piecewise interrupted structure that leaves channels and draws power from the one or more power-rails into the transistor stack.

In some embodiments, the plurality of power rails are positioned over the one or more conductive planes. Each of the one or more conductive planes is positioned along a respective power rail so as to form a continuous connection.

In the semiconductor device, one or more of the plurality of S/D local interconnects are electrically coupled to the one or more conductive planes. In addition, a plurality of vertical contacts are formed in a direction perpendicular to the substrate and electrically coupled to the plurality of S/D local interconnects. At least one of the plurality of vertical contacts is electrically coupled to an output signal.

In the semiconductor device, the n-type transistor and the p-type transistor share a gate structure that is electrically coupled to one of the plurality of gate electrodes.

According to another aspect of the disclosure, a method of forming a semiconductor device is provided. The method includes forming a transistor stack that includes a plurality of transistor pairs stacked over a substrate, wherein each transistor pair of the plurality of transistor pairs includes a n-type transistor and a p-type transistor that are stacked over one another. The plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs. The method also includes forming one or more conductive planes over the substrate. The one or more conductive planes are positioned adjacent to the transistor stack, span a height of the transistor stack and are electrically coupled to the transistor stack.

In some embodiments, the method can include forming a plurality of power rails. In some embodiments, the plurality of power rails are positioned below the transistor stack. Each of the one or more conductive planes extends along a respective power rail of the plurality of power rails so as to form a continuous connection. In some embodiments, the plurality of power rails are positioned below the transistor stack, where each of the one or more conductive planes is positioned over and across two or more power rails of the plurality of power rails so as to form two or more connection points. In some embodiments, the plurality of power rails are positioned over the one or more conductive planes, where each of the plurality of power rails extends along a respective power rail of the plurality of power rails so as to form a continuous connection.

According to yet another aspect of the disclosure, a semiconductor device includes a plurality of transistor pairs that are stacked over a substrate, where each transistor pair of the plurality of transistor pairs includes a n-type transistor and a p-type transistor that are stacked over one another. The device also includes a plurality of gate electrodes that are stacked over the substrate and electrically coupled to gate structures of the plurality of transistor pairs. In the device, a plurality of source/drain (S/D) local interconnects are stacked over the substrate and electrically coupled to source regions and drain regions of the plurality of transistor pairs. In addition, one or more conductive planes are formed over the substrate, where the one or more conductive planes are positioned adjacent to the plurality of transistor pairs, span a height of the plurality of transistor pairs and are electrically coupled to the plurality of transistor pairs. The device further includes a plurality of power rails that are positioned over the substrate and electrically coupled to the one or more conductive planes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein provide a novel power delivery network (PDN) that can be used (for example) for 3D integrated logic using stacked transistors.

Complementary FET devices (CFET) are three-dimensionally stacked logic transistors in which either a NMOS or a PMOS transistor is situated overtop its complement. Such a configuration enables an area-scaling and routing congestion improvement for logic standard cells as well as SRAM memory cells. 3D integration is a viable option to continue semiconductor scaling in spite of inevitable saturation in critical dimension scaling. As contacted gate pitch reaches its scaling limit due to manufacturing variability and electrostatic device limitations, two-dimensional transistor density scaling stops. Even experimental new transistor designs, such as vertical channel gate-all-around transistors, that might be able to one day overcome these contacted gate pitch scaling limits, do not promise to get semiconductor scaling back on track. This is because resistance, capacitance, and reliability concerns limit wire pitch scaling, thereby limiting the density with which transistors can be wired into circuits.

A 3D integration, i.e. the vertical stacking of multiple devices, aims to overcome these scaling limitations by increasing transistor density in volume rather than area. A key limitation to the achievable circuit performance in 3D integrated devices is the effectiveness with which power can be delivered into the transistors.

Figure 1A:
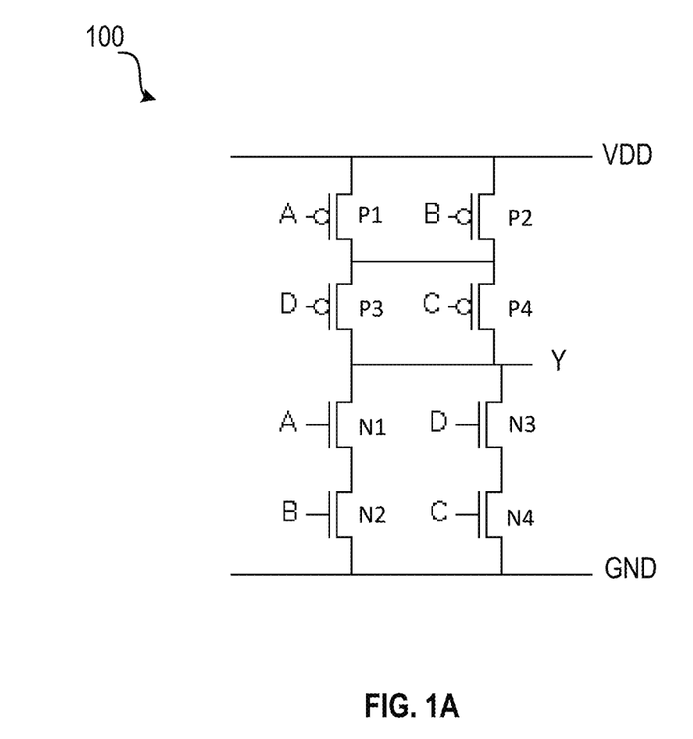
FIG. 1A is a schematic circuit diagram of an And-Or-Invert 22 (AOI22) cell, in accordance with some embodiments.

A majority of logic chips are generated from logic primitives rendered in standard cells. One exemplary standard cell can be shown in FIG. 1A. FIG. 1A illustrates a schematic circuit diagram of an And-Or-Invert (AOI) cell 100. The AOI cell 100 herein is a moderately complex standard cell with transistors that are grouped in parallel pairs on a p-fet side of the cell and serial pairs on a n-fet side of the CMOS circuit. For example, the p-fet side can includes four p-type transistors P1-P4, where P1 and P2 are connected in parallel, and P3 and P4 are connected in parallel. The n-fet side can includes four n-type transistors N1-N4, where N1 and N2 are serially connected and N3 and N4 are serially connected. The AOI cell 100 is electrically coupled to four inputs A-D and an output Y. Each of the four inputs A-D is coupled to a respective n-type gate and p-type gate of the AOI cell 100. For example, the input A is coupled to a n-type gate of n-type transistor N1 and a p-type gate of p-type transistor P1. In addition. The AOI cell 100 is connected to a supply voltage VDD that are coupled to source regions of the p-type transistors P1 and P2. The AOI cell 100 is further connected to a ground voltage GND (also referred to as VSS) that is coupled to source regions of the n-type transistors N2 and N4.

Figure 1B:
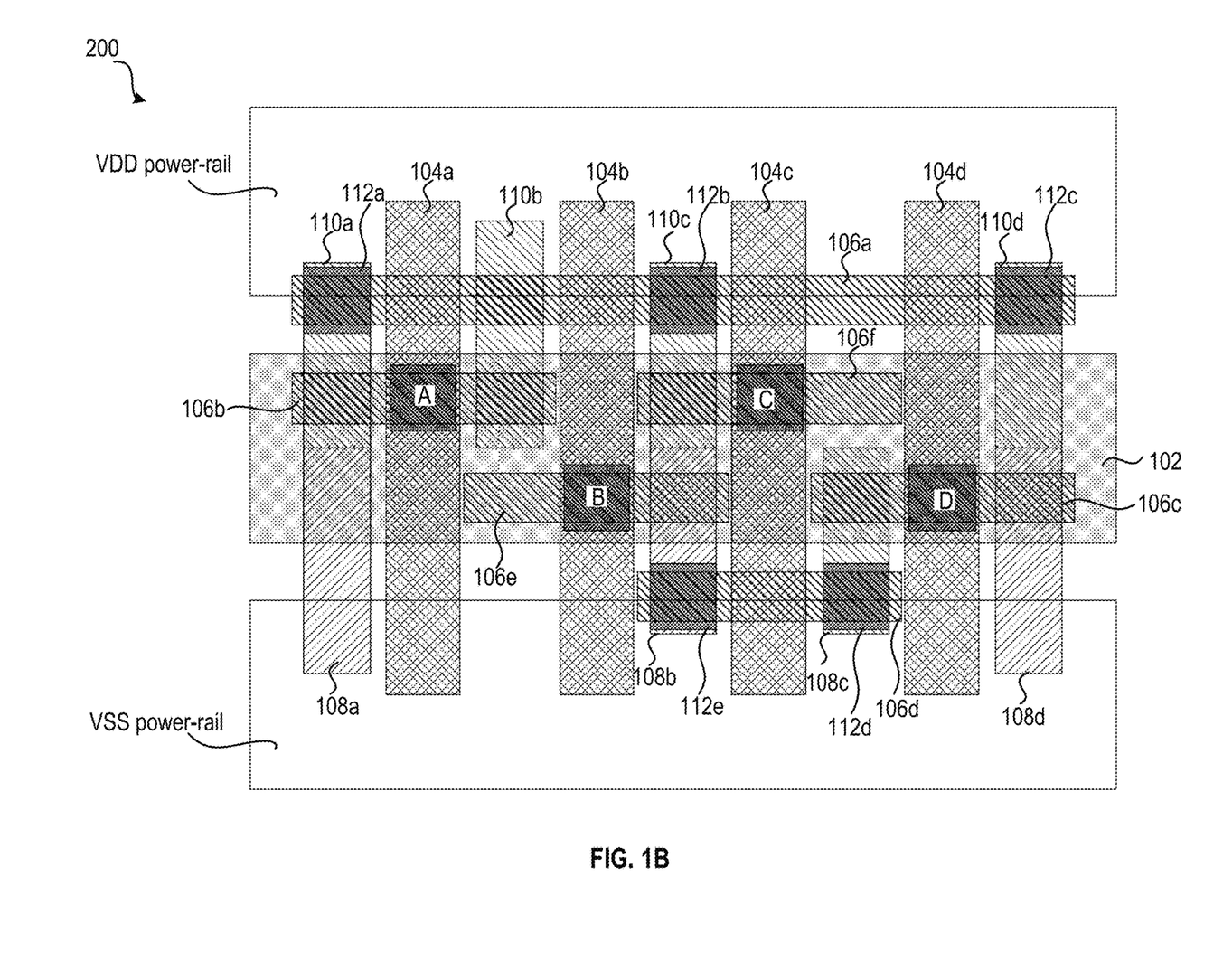
FIG. 1B is a top down layout view of a complementary field enhanced transistor (CFET) implementation of an AOI22 cell, in accordance with some embodiments.

FIG. 1B is an associated layout 200 for the AOI cell 100 that is formed based on a non-3D integrated CFET rendering. FIG. 1B illustrates a top down view of the layout of the AOI cell 100. As shown in FIG. 1B, the layout 200 can have an active region 102 that are doped through an ion implantation process. The layout 200 can have four gate structures 104a and 104b. The layout 200 also includes a plurality of lowest level of metal layer (e.g., MO) 106a-106f. The layout 200 can include a plurality of n-fet source/drain (S/D) local interconnects 108a-108d, and a plurality of p-fet source/drain (S/D) local interconnects 110a-110d. The n-fet source/drain (S/D) local interconnects 108 and the p-fet source/drain (S/D) local interconnects 110 are connected to the MO 106 through a plurality of contacts 112a-112e. In addition, the layout 200 can include a plurality of gate contacts A-D that are connected the gate structures 104 and the MO to access the inputs A-D respectively. The power delivery under discussion herein is shown in the circuit schematic FIG. 1A, as VDD and GND (also referred to as VSS). In the top down view of the layout 200, the VDD and VSS power-rails are shown as wide bars at a top and a bottom horizontal edges of the layout 200. Power-taps (not shown) formed in the S/D local interconnects 108 and 110 are used to connect the transistors' source regions to these power-rails.

Figure 2A:
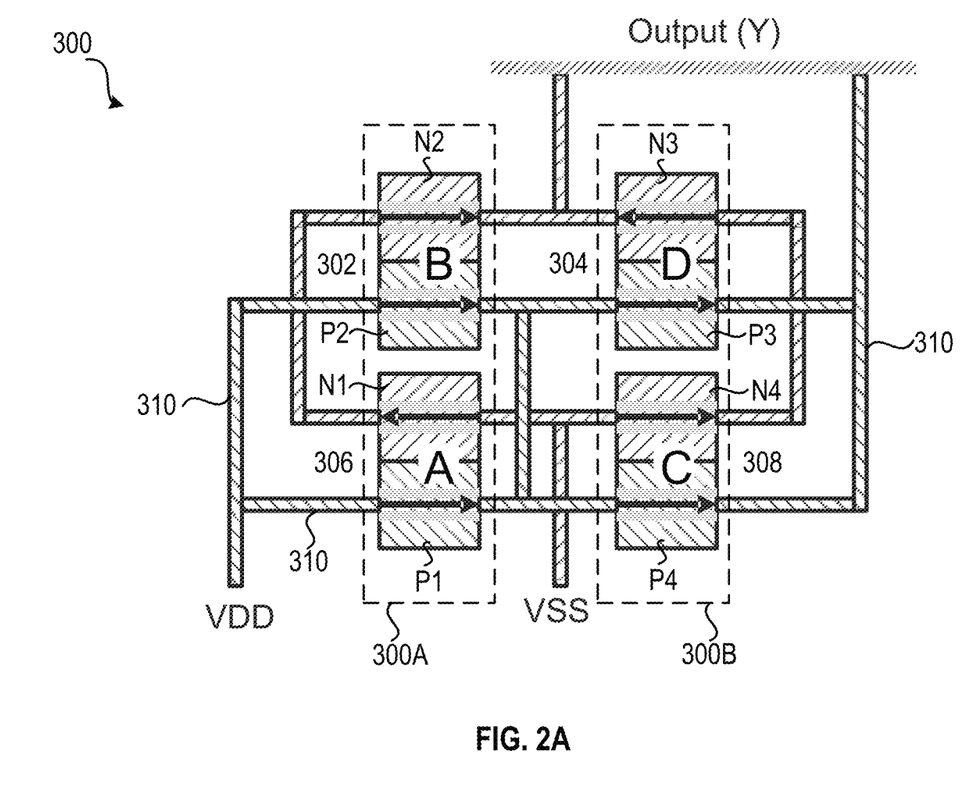
FIG. 2A is a schematic diagram of an AOI22 cell that is formed by using a first vertical routing technique, in accordance with some embodiments.

It is desired that a 3D integration follows a monolithic integration of stacked devices, i.e. a concurrent manufacturing of multiple devices in a 3D space by using "vertical routing". FIG. 2A illustrates such a configuration and highlights the remaining design and process complexities. As shown in FIG. 2A, the AOI cell 100 can be formed by a transistor stack 300 through a vertical routing process. The transistor stack 300 can have four CFET devices 302-308 that are stacked into two groups 300A-300B in parallel. Each of the two groups can further have two CFET devices stacked over one another. For example, the group 300A can have the CFET device 302 that is stacked over the CFET device 306. Each of the CFET devices can include a n-type transistor and a p-type transistor. The n-type transistor and p-type transistor can have a shared gate structure. For example, the CFET device 302 includes the n-type transistor N1 and the p-type transistor P1, which are illustrated in FIG. 1A. The four CFET devices 302-308 are connected through the vertical routing by a plurality of interconnects 310. The four CFET devices are further coupled to the supply voltage VDD, the ground voltage VSS, and the output Y.

Figure 2B:
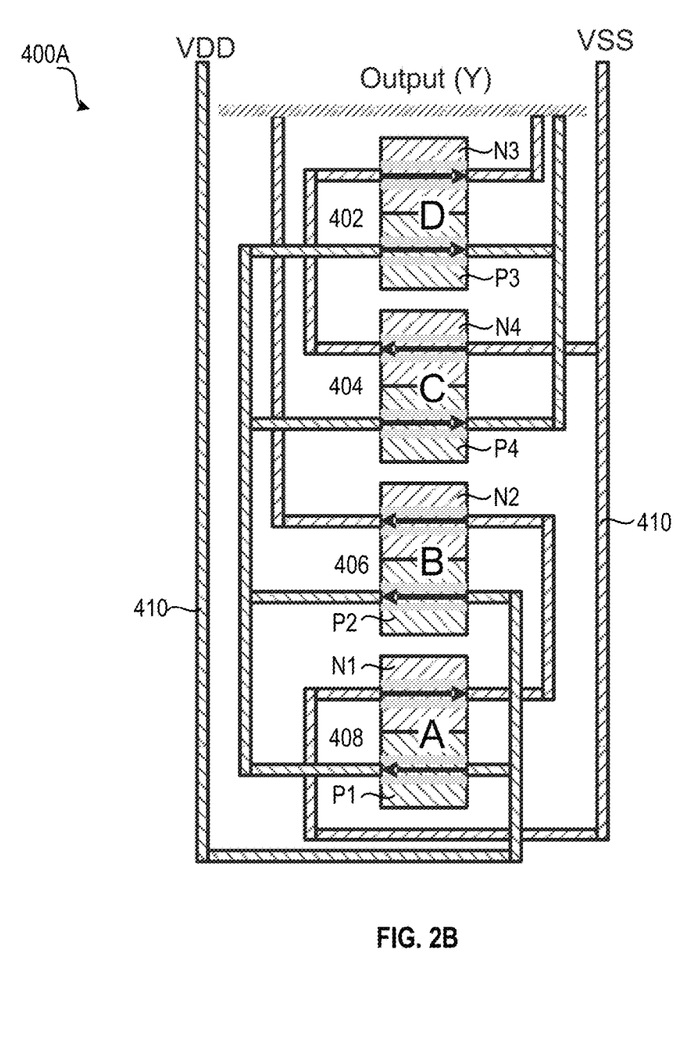
FIG. 2B is a schematic diagram of an AOI22 cell that is formed by using a second vertical routing technique, in accordance with some embodiments.
Figure 2C:
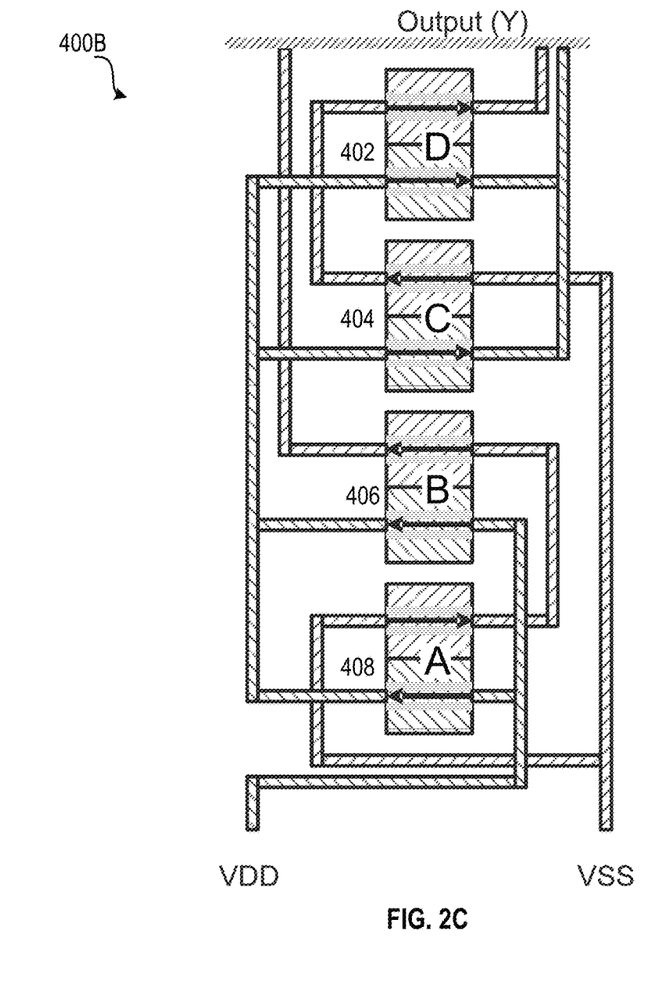
FIG. 2C is schematic diagram of an AOI22 cell that is formed by using a third vertical routing technique, in accordance with some embodiments.

The vertical wiring technique addresses one major inefficiency in 3D integration by stacking active transistors without intermediate wiring levels, where all transistors can be patterned and manufactured concurrently. One challenge that remains can be shown in FIG. 2B. FIG. 2B is a schematic diagram of the AOI cell 100 that is formed by using a second vertical routing technique, in accordance with some embodiments. As shown in FIG. 2B, the AOI cell 100 can implemented by a transistor stack 400A. The transistor stack 400A includes four CFET devices 402-408 stacked in a row along a direction perpendicular to a substrate. The four CFET devices 402-408 are connected through the vertical routing by a plurality of interconnects 410. As shown in FIG. 2B, power connections, both VDD (i.e., positive voltage) and GND (i.e., negative voltage, also referred to as VSS), have to be made into transistors at various levels in the transistor stack 400A. These connections have to be made robustly, minimizing resistance that leads to voltage drops when large numbers of transistors draw current from the power rails (e.g., VDD and VSS), while at the same time not occupying excessive amounts of space which would detract from transistor density scaling. FIG. 2C is a schematic diagram of the AOI cell 100 that is formed by using a third vertical routing technique. As shown in FIG. 2C, the AOI cell 100 can be implemented by a transistor stack 400B. Similar to 400A in FIG. 2A, the power connections, both VDD (i.e. positive voltage) and GND (i.e. negative voltage, also referred to as VSS), have to be made into transistors at various levels in the transistor stack 400B.

Accordingly, techniques herein provide a vertical power-wall structure that supports a monolithically integrated 3D logic or memory devices. Such a structure enables power to be drawn at all levels throughout a device stack. Additionally, power can be fed or delivered to the vertical power-walls from either above (as in conventional power delivery networks), or from below through buried power-rails. Such buried power-rails (or conventional top down PDN) can run either parallel to the vertical power-walls or perpendicular to them. Power-walls can be continuous, vertical power walls.

Figure 3A:
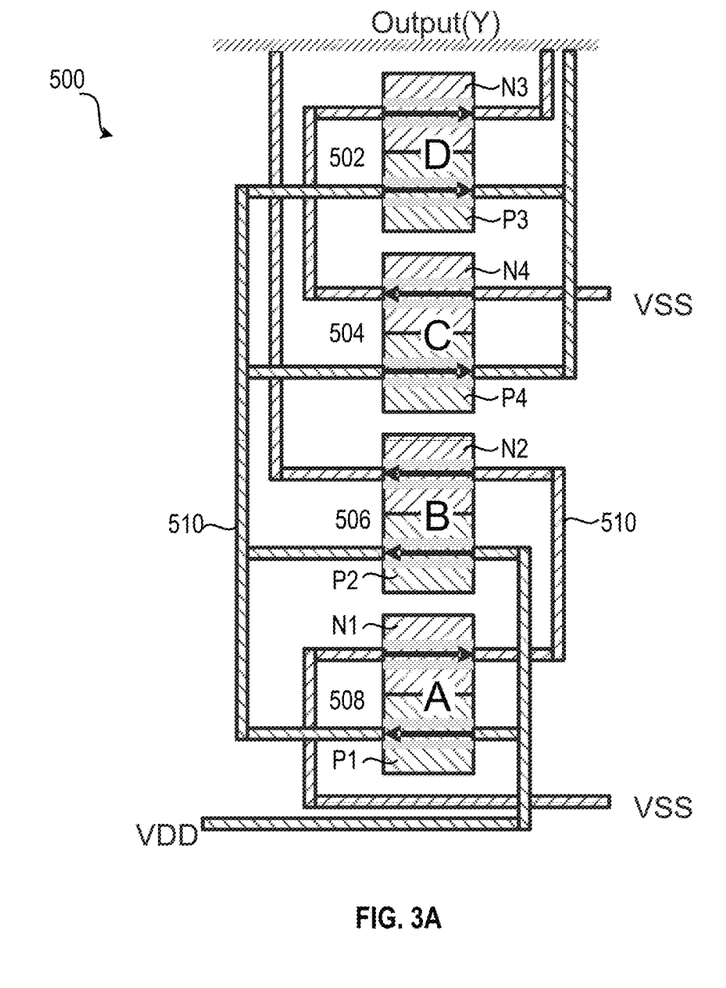
FIG. 3A is a schematic diagram of an AOI22 cell that is formed by using a vertical routing technique, in accordance with some embodiments.

FIG. 3A is a schematic diagram of the AOI cell 100 that is formed by using an improved vertical routing technique, which can be combined with the power-wall structure. As shown in FIG. 3A, the AOI cell 100 can be implemented by a transistor stack 500. The transistor stack 500 includes four CFET devices 502-508 stacked in a row along a direction perpendicular to a substrate. Each of the four CFETs includes a transistor pair. The transistor pair includes a n-type transistor and a p-type transistor. For example, the CFET 502 includes the n-type transistor N3 and the p-type transistor P3. The four CFET devices 502-508 are connected through the vertical routing by a plurality of interconnects 510. In some embodiments, the plurality of interconnects 510 can include a plurality of vertical contacts, a plurality of source/drain (S/D) local interconnects, and a plurality of gate electrodes that are illustrated in FIG. 3B.

Figure 3B:
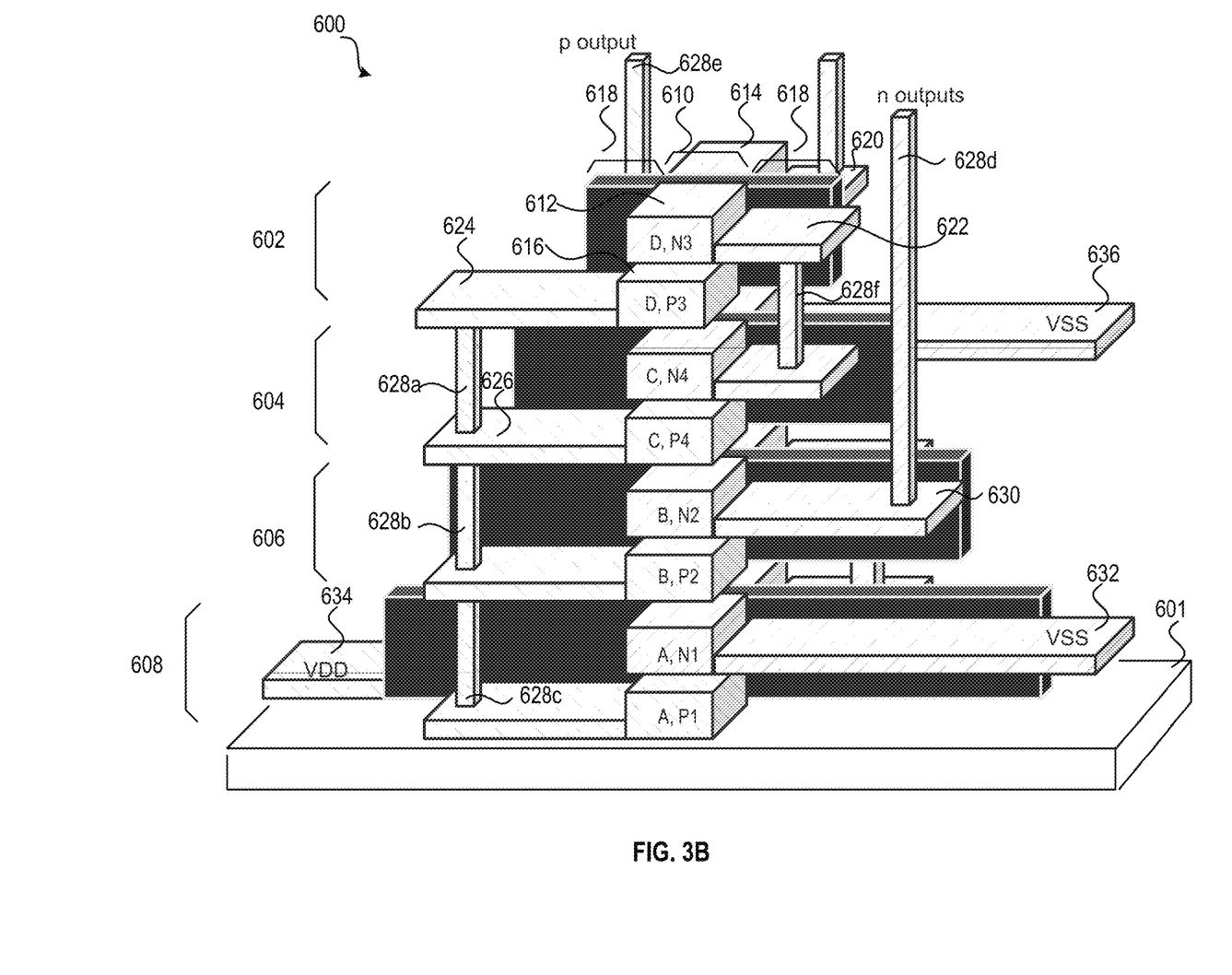
FIG. 3B is a schematic view of an AOI22 cell that is formed based on a 3D integrated CFET stack, in accordance with some embodiments.

FIG. 3B is a schematic view of the AOI cell 100 that is formed based on a 3D integrated transistor stack 600. The transistor stack 600 can includes four CFET devices 602-608 that are formed over a substrate 601. Each of the four CFET devices can include a transistor pair that is formed by a n-type transistor and a p-type transistor. For example, the CFET device 602 can include the n-type transistor N3 that is coupled to the input D, and the p-type transistor P3 that is coupled to the input D. The n-type transistor and the p-type transistor can have a shared gate structure. The n-type transistor is positioned over the p-type transistor. The gate structure can surround a n-channel region of the n-type transistor and a p-channel region of the p-type transistor. The channel region can have a sheet, wire or bar configuration. The n-type transistor can have a source region and a drain region that are position at two ends of the n-channel region respectively, where the gate structure surrounds the n-channel region, and positioned between the source region and the drain region of the n-type transistor. The p-type transistor can have a source region and a drain region that are positioned at two ends of the p-channel region respectively, where the gate structure surrounds the p-channel region, and positioned between the source region and the drain region of the p-type transistor. Moreover, the gate structure can be electrically coupled to a gate electrode. The source region and the drain region can have a source local interconnect and a drain local interconnect respectively.

For example, as shown in FIG. 3B, the n-type transistor N3 and the p-type transistor P3 have a shared gate structure 610. The n-type transistor N3 has a source region 612 and a drain region 614 that are position at two ends of the n-channel region. The n-channel region is surrounded by the gate structure 610, where the gate structure 610 is positioned between the source region 612 and the drain region 614. The p-type transistor P3 has a source region 616 and a drain region behind the gate structure 610. The source region 616 and the drain region are positioned at two ends of the p-channel region. Similarly, the p-channel region is surrounded by the gate structure 610, where the gate structure 610 is positioned between the source region 616 and the drain region of the p-type transistor P3.

The gate structure 610 can have one or more gate electrodes 618. The gate electrodes 618 can be positioned at two ends of the gate structure 610. The source region 612 and the drain region 614 of the n-type transistor N3 can have a source local interconnect 622 and a drain local interconnect 620 respectively. Similarly, the source region 616 of the p-type transistor P3 can have a source local interconnect 624, and the drain region of the p-type transistor P3 can have a drain local interconnect positioned behind the gate electrodes 618. It should be noted that a source local contact 632 of the transistor N1 and a source local interconnect 636 of the transistor N4 are coupled to the ground voltage VSS (or GND), and a source local contact 643 of transistor P1 is coupled to the supply voltage VDD.

Still referring to FIG. 3B, the transistor stack 600 can have a plurality of vertical contacts. The vertical contacts can be coupled to the source/drain (S/D) local interconnects, inputs, outputs, VSS, or VDD. For example, the transistor stack 600 can include vertical contacts 628a-628f. The vertical contact 628a connects a source local interconnect 624 of the transistor P3 and a source local contact 626 of the transistor P4. The vertical contact 628d is coupled to a drain local contact 630 of the transistor N2, and server as an n-type output terminal.

It should be noted that FIG. 3B is merely an example. The transistor stack 600 can have any number of CFET devices that are stacked over the substrate 601. The CFET devices can be spaced apart from one another by a plurality of dielectric layers which is not shown. The CFET device can have a n-type transistor and a p-type transistor. In some embodiments, the n-type transistor can be positioned over the p-type transistor. In some embodiment, the p-type transistor can be positioned over the n-type transistor. In addition, the n-type transistor and the p-type transistor can be separated by an insulating layer. Further, it should be noted that the source region and the gate structure are separated by an insulating layer, and the drain region and the gate structure are also separated by an insulating layer.

The transistor stacks illustrated in FIGS. 3A and 3B gain advantages over the transistor stacks illustrated in FIGS. 2A-2C. As shown in FIG. 3B, the transistor stack 600 can have VDD and GND power taps formed along side portions of the transistor stack. For example, a VDD connection can be made at a lowest p-transistor level (i.e., transistor P1) and is shown running behind the gate-stack towards the left. Two GND connections can be made to the n-transistors N2 and N4. These two GND power-taps are shown running towards the right (one in front of the gate stack, one behind). By forming power taps along side portion of the transistor stack, subsequently formed power-walls can be tapped into at any level of the transistor stack to draw power into the devices.

Figure 4:
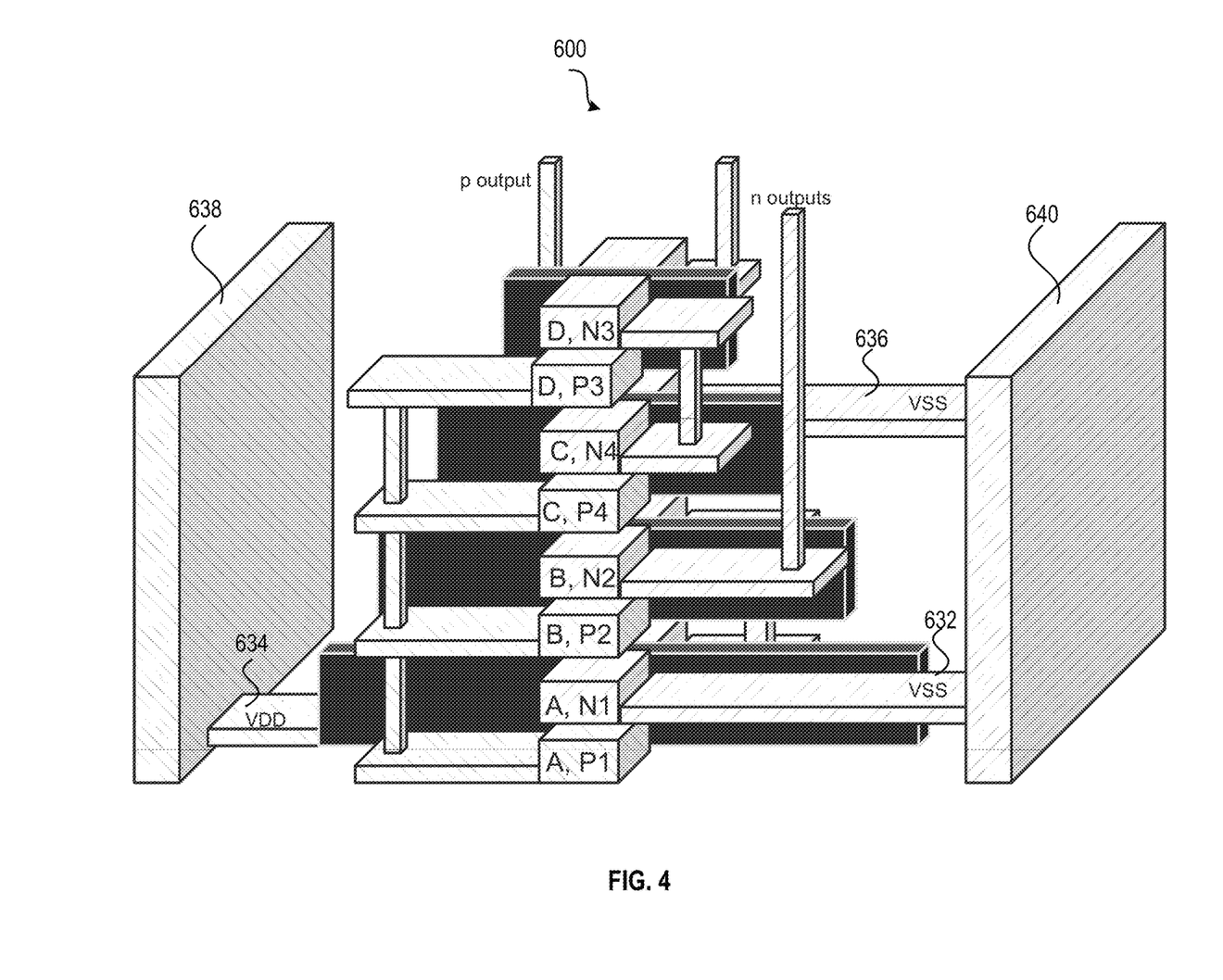
FIG. 4 is a schematic view of a power wall structure that is coupled to an AOI22 cell, in accordance with some embodiments.

Techniques herein overcome the challenges mentioned above can be illustrated in FIG. 4. FIG. 4 shows an example configuration of vertical power-walls. As shown in FIG. 4, two vertical power-walls 638 and 640 can be formed. The vertical power-walls 638 and 640 can be vertically continuous power-planes (or conductive planes) that span an entire height of a transistor stack (e.g., transistor stack 600) and can be tapped into at any level of the transistor stack to draw power into the devices. For example, the vertical power-wall 638 can be coupled to the VDD power tap, and the vertical power-wall 640 can be coupled to the two GND power taps. Accordingly, power can be drawn into the transistor stack 600 based on the connection between the power-walls and the power taps.

The vertical power-walls can be made of tungsten, ruthenium, copper, cobalt, aluminum, or other suitable conductive materials. The vertical power-walls can be formed in a dielectric stack based on a combination of a patterning process and deposition process. The patterning process can include a photolithography process and an etching process, where the photolithography process forms a resist pattern, and the etching process transfers the pattern into the dielectric stack to form openings. The deposition process can be introduced subsequently to deposit a conductive material into the openings and form the power-walls. The deposition process can include chemical vapor deposition (CVD), physical vapor deposition (PVD), atomic layer deposition (ALD), diffusion, or other suitable deposition processes. In some embodiments, the power-walls can be formed after the transistor stack 600 is formed. In some embodiments, the power-walls can be formed before the transistor stack 600 is formed.

Figure 5:
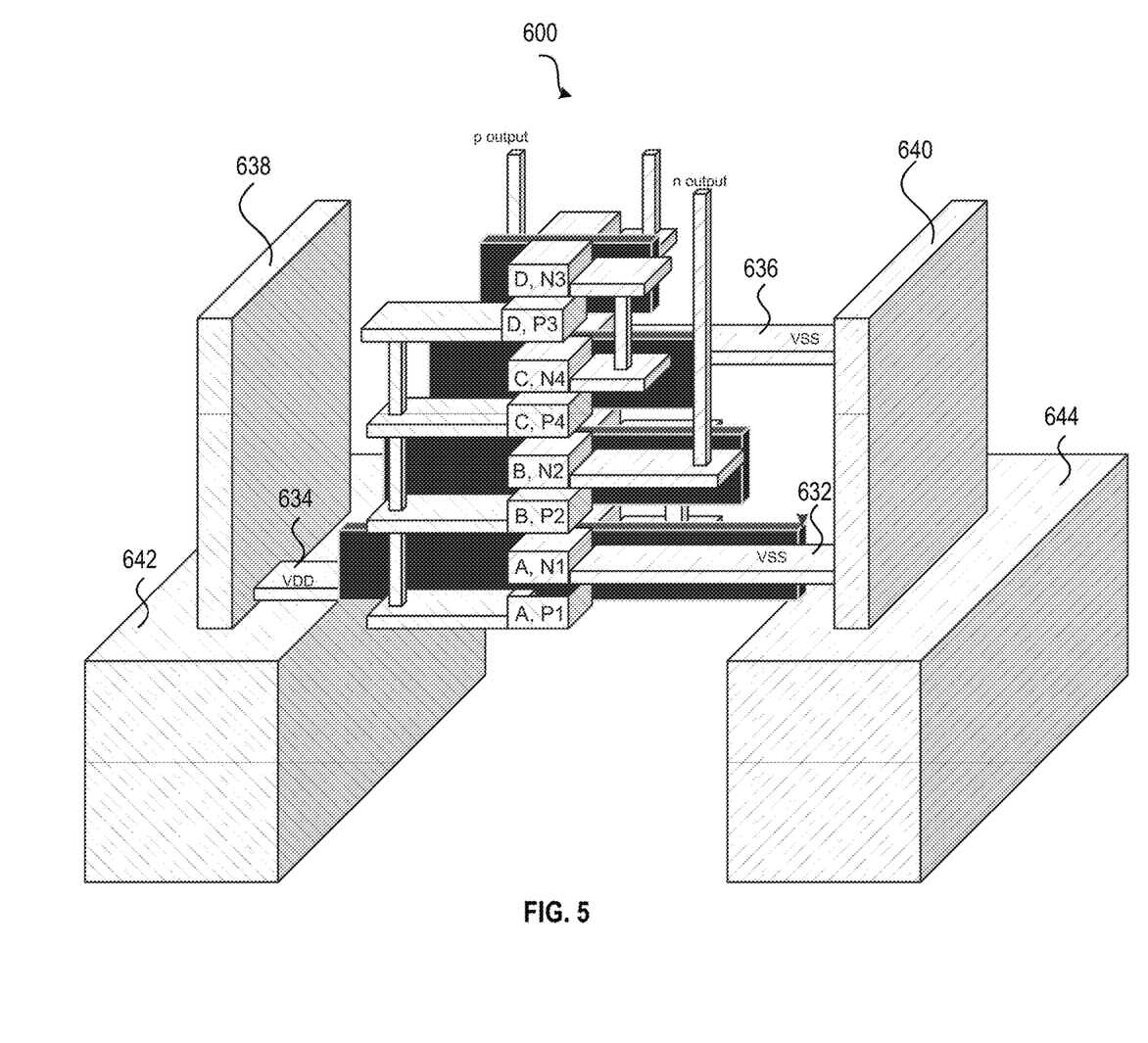
FIG. 5 is a schematic view of a first connection configuration between a power wall structure and a power-rail structure, in accordance with some embodiments.

FIG. 5 shows a first implementation of vertical power-wall to buried power-rail connection. As shown in FIG. 5, two buried power-rails 642 and 644 can run parallel to the vertical power-walls 638 and 640 with continuous connections, where each of the power-walls is positioned over and extends along a respective power-rail so as to form a continuous connection. The power-rails provide the VDD and VSS voltage, and can be made of tungsten, ruthenium, cobalt, or other conductive materials. By connecting to the power-rails, the power-walls draw power from the power-rails into the transistor stack 600.

Figure 6:
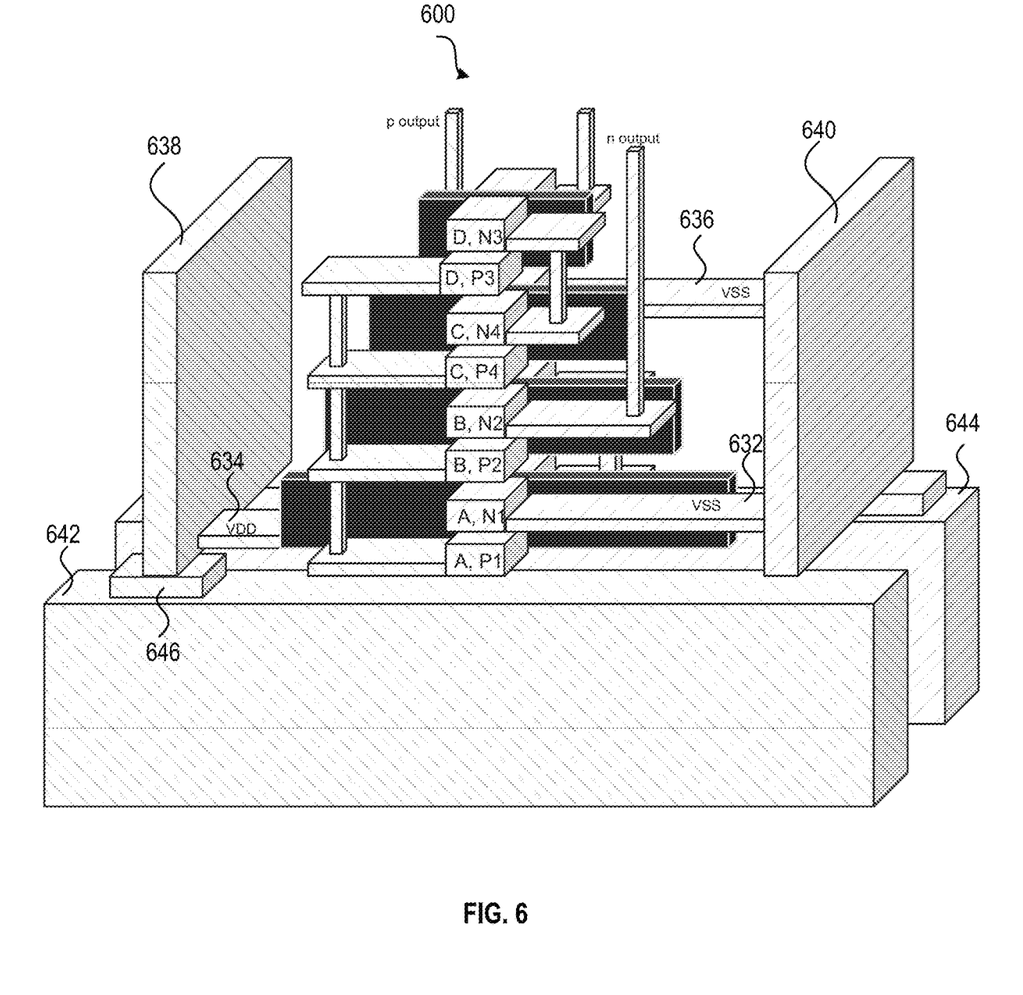
FIG. 6 is a schematic view of a second connection configuration between a power wall structure and a power-rail structure, in accordance with some embodiments.

FIG. 6 shows a second implementation of vertical power-wall to buried power-rail connection. As shown in FIG. 6, the vertical power-walls 638 and 640 can run perpendicular connecting to the respective power-rail at alternating crossing points. Therefore, each of the vertical power-walls is positioned over and across two power-rails 642 and 644 so as to form two or more connection points. A perpendicular layout shown in FIG. 6 provides a more uniform power-grid improving stress distribution and thermal load on the chip. In some embodiments, local contacts can be formed between the power-rails and the power-walls. For example, a local contact 646 can be positioned between the power-rail 642 and the power-wall 638.

Figure 7:
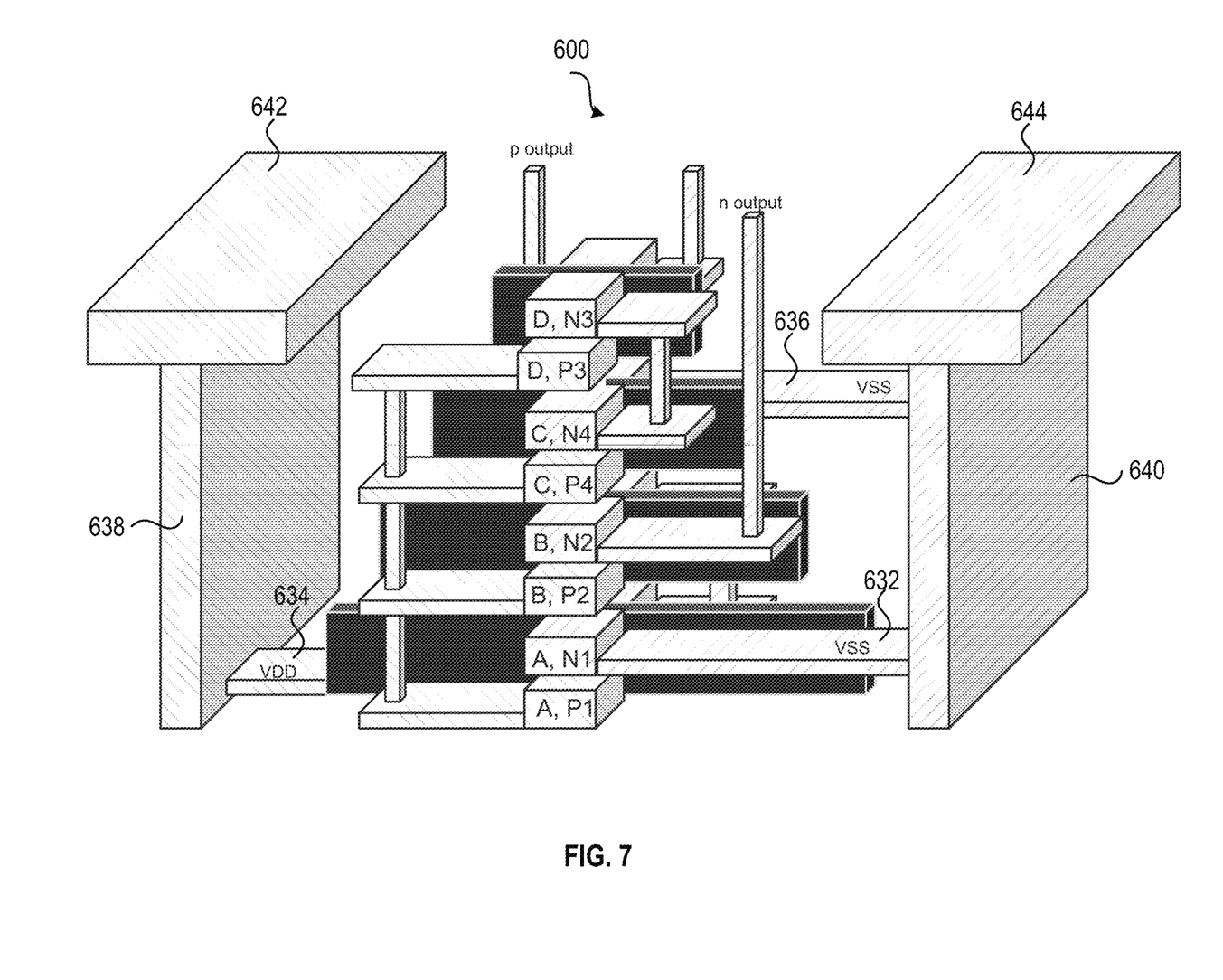
FIG. 7 is schematic view of a third connection configuration between a power wall structure and a power-rail structure, in accordance with some embodiments.

FIG. 7 shows a third implementation of vertical power-wall to buried power-rail connection. As shown in FIG. 7, the power-rails 642 and 644 can be positioned over the vertical power-walls 638 and 640. Each of power-walls extends along a respective power-rail so as to form a continuous connection.

In the current disclosure, a set of vertical power-walls extends over an entire height of the stacked 3D logic or memory device, allowing direct contact to power-taps at any transistor level in the stack. Such a configuration brings several benefits. For example, the power-walls can reduce a space of the device because less interconnects are required. In addition, the power-wall can reduce an interconnecting resistance between the transistor stack and the power-rails.

In the current disclosure, the power-wall herein can connect either to a conventional power rail from above or buried power-rails from below. Positioning can extend/run either parallel to buried or conventional power-rails with continuous connections, or perpendicular forming a power-grid with selective connections at alternating cross points. Such structures can be formed as either a continuous lateral structure or a piecewise interrupted structure leaving channels for signal wiring. Note that example embodiments herein focus on 3D logic structures, but one skilled in the art can appreciate how techniques herein can be applied to 3D memory structures such as stacked SRAM. In the present disclosure, the AOI cell is merely an example. The disclosed power-wall can be applied to other logic structures, analog structures, memory structures, or other semiconductor devices.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a transistor stack having a plurality of transistor pairs that are stacked over a substrate, wherein each transistor pair of the plurality of transistor pairs includes a n-type transistor and a p-type transistor that are stacked over one another, the plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs; and
    one or more conductive planes formed over the substrate, the one or more conductive planes being positioned adjacent to the transistor stack, spanning a height of the transistor stack and being electrically coupled to the transistor stack.

2. The device of claim 1, further comprising:
    a plurality of power rails that are positioned below the transistor stack, wherein each of the one or more conductive planes is positioned over and extends along a respective power rail of the plurality of power rails so as to form a continuous connection.

3. The device of claim 1, further comprising:
    a plurality of power rails that are positioned below the transistor stack, wherein each of the one or more conductive planes is positioned over and across two or more power rails of the plurality of power rails so as to form two or more connection points.

4. The device of claim 2, wherein the one or more conductive planes comprise a continuous lateral structure to draw power from the plurality of power rails into the transistor stack.

5. The device of claim 2, wherein the one or more conductive planes comprise a piecewise interrupted structure with one or more channels being arranged therein, the piecewise interrupted structure being configured to create a conductive path from the plurality of power rails into the transistor stack.

6. The device of claim 1, further comprising:
a plurality of power rails, the plurality of power rails being positioned over the one or more conductive planes, each of the one or more conductive planes being positioned along a respective power rail of the plurality of power rails so as to form a continuous connection.

7. The device of claim 1, wherein one or more of the plurality of S/D local interconnects are electrically coupled to the one or more conductive planes.

8. The device of claim 1, further comprising:
a plurality of vertical contacts formed in a direction perpendicular to the substrate and electrically coupled to the plurality of S/D local interconnects, at least one of the plurality of vertical contacts being electrically coupled to an output signal.

9. The device of claim 1, wherein the n-type transistor and the p-type transistor share a gate structure that is electrically coupled to one of the plurality of gate electrodes.

10. A method of forming a semiconductor device, comprising:
forming a transistor stack including a plurality of transistor pairs that are stacked over a substrate, wherein each transistor pair of the plurality of transistor pairs includes a n-type transistor and a p-type transistor that are stacked over one another, the plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs; and
forming one or more conductive planes over the substrate, the one or more conductive planes being positioned adjacent to the transistor stack, spanning a height of the transistor stack and being electrically coupled to the transistor stack.

11. The method of claim 10, further comprising:
forming a plurality of power rails, the plurality of power rails being positioned below the transistor stack, each of the one or more conductive planes extending along a respective power rail of the plurality of power rails so as to form a continuous connection.

12. The method of claim 10, further comprising:
forming a plurality of power rails, the plurality of power rails being positioned below the transistor stack, each of the one or more conductive planes being positioned over and across two or more power rails of the plurality of power rails so as to form two or more connection points.

13. The method of claim 10, further comprising:
forming a plurality of power rails, the plurality of power rails being positioned over the one or more conductive planes, each of the plurality of power rails extending along a respective power rail of the plurality of power rails so as to form a continuous connection.

14. The method of claim 10, wherein the one or more conductive planes comprises a continuous lateral structure to draw power from a plurality of power rails into the transistor stack.

15. The method of claim 10, wherein the one or more conductive planes comprises a piecewise interrupted structure that leaves channels and draws power from a plurality of power rails into the transistor stack.

16. The method of claim 10, wherein one or more of the plurality of S/D local interconnects are electrically coupled to the one or more conductive planes.

17. The method of claim 10, further comprising:
forming a plurality of vertical contacts that are positioned in a direction perpendicular to the substrate and electrically coupled to the plurality of S/D local interconnects, at least one of the plurality of vertical contacts being electrically coupled to an output signal.

18. A semiconductor device, comprising:
a plurality of transistor pairs that are stacked over a substrate, each transistor pair of the plurality of transistor pairs including a n-type transistor and a p-type transistor that are stacked over one another;
a plurality of gate electrodes that are stacked over the substrate and electrically coupled to gate structures of the plurality of transistor pairs;
a plurality of source/drain (S/D) local interconnects that are stacked over the substrate and electrically coupled to source regions and drain regions of the plurality of transistor pairs;
one or more conductive planes formed over the substrate, the one or more conductive planes being positioned adjacent to the plurality of transistor pairs, spanning a height of the plurality of transistor pairs and being electrically coupled to the plurality of transistor pairs; and
a plurality of power rails that are positioned over the substrate and electrically coupled to the one or more conductive planes.

19. The device of claim 18, wherein the plurality of power rails are positioned over the one or more conductive planes, each of the plurality of power rails extending along a respective power rail of the plurality of power rails so as to form a continuous connection.

20. The device of claim 18, wherein the plurality of power rails are positioned below the one or more conductive planes, each of the one or more conductive planes either being positioned over and extending along a respective power rail of the plurality of power rails so as to form a continuous connection, or being positioned over and across two or more power rails of the plurality of power rails so as to form two or more connection points.

* * * * *